United States Patent
Yang et al.

(10) Patent No.: US 11,506,458 B2
(45) Date of Patent: Nov. 22, 2022

(54) ENCLOSED HEAT SINK WITH SIDE WALL STRUCTURE

(71) Applicant: AMULAIRE THERMAL TECHNOLOGY, INC., New Taipei (TW)

(72) Inventors: Ching-Ming Yang, New Taipei (TW); Reui-Jen Yang, New Taipei (TW); Tze-Yang Yeh, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 209 days.

(21) Appl. No.: 17/016,378

(22) Filed: Sep. 10, 2020

(65) Prior Publication Data

US 2022/0074682 A1    Mar. 10, 2022

(51) Int. Cl.
  *F28F 9/00*      (2006.01)
  *F16B 5/08*      (2006.01)
  *B23K 31/02*     (2006.01)

(52) U.S. Cl.
  CPC .......... *F28F 9/001* (2013.01); *B23K 31/02* (2013.01); *F16B 5/08* (2013.01); *F28F 2275/06* (2013.01)

(58) Field of Classification Search
  CPC ...... F28F 9/001; F28F 2275/06; B23K 31/02; B23K 33/004; B23K 2101/12; B23K 2101/14; B23K 1/203; B23K 1/0012; F16B 5/08; H01L 23/3736; H01L 23/427
  See application file for complete search history.

(56) References Cited

U.S. PATENT DOCUMENTS

| | | | | |
|---|---|---|---|---|
| 2007/0025085 | A1* | 2/2007 | Chang ............. | F28D 15/0233 361/704 |
| 2018/0093346 | A1* | 4/2018 | Yamagishi ........ | B29C 65/1635 |
| 2020/0008291 | A1* | 1/2020 | Brandenburg ..... | H01L 23/3736 |

FOREIGN PATENT DOCUMENTS

| CN | 107891224 A | 4/2018 |
|---|---|---|
| TW | I247873 B | 1/2006 |

* cited by examiner

*Primary Examiner* — Lee A Holly
(74) *Attorney, Agent, or Firm* — Li & Cai Intellectual Property Office

(57) ABSTRACT

An enclosed heat sink with a side wall structure is provided. The side wall structure includes a welding body having a first welding plane and a side wall structure having a second welding plane. The first welding plane and the second welding plane are pressured and welded to each other, such that the welding body and the side wall structure encapsulate a cavity. A width of the second welding plane is smaller than a width between two side surfaces of the side wall structure.

9 Claims, 8 Drawing Sheets

ENCLOSED HEAT SINK WITH SIDE WALL STRUCTURE

CROSS-REFERENCE TO RELATED PATENT APPLICATION

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an enclosed heat sink, and more particularly to an enclosed heat sink with a side wall structure.

BACKGROUND OF THE DISCLOSURE

Heat sinks are widely applied to various types of products. Generally speaking, a high-end product is usually equipped with a water cooling heat sink. The water cooling heat sink has advantages of being more quiet and having a stable cooling effect compared to an air cooling heat sink. Moreover, the water cooling heat sink has an upper workpiece and a lower workpiece welded to each other and forms an enclosed space therebetween, so as to have a working fluid filled inside the water cooling heat sink.

However, during the welding process of applying a solder, bubbles and residuals such as slags and soldering flux are likely to form when the solder is melting. Furthermore, when workpieces to be welded are complex, a pre-disposed solder is disposed between the upper workpiece and the lower workpiece, and pressure is applied to the upper workpiece and the lower workpiece during the welding process, which makes it difficult for impurities to be discharged from the welding plane. A large number of voids are formed, resulting in poor soldering, especially in cases of workpieces with soldering flux applied.

Therefore, it has become an important issue for the industry to overcome the abovementioned technical inadequacies.

SUMMARY OF THE DISCLOSURE

In response to the above-referenced technical inadequacies, the present disclosure provides an enclosed heat sink with a side wall structure.

In one aspect, the present disclosure provides an enclosed heat sink with a side wall structure including a welding body having a first welding plane and a side wall structure having a second welding plane. The first welding plane and the second welding plane are pressured and welded to each other, such that a cavity is formed between the welding body and the side wall structure. A width of the second welding plane is less than a width between two side surfaces of the side wall structure.

In a preferable embodiment, the first welding plane and the second welding plane are pressured and welded to each other through a pre-disposed solder.

In a preferable embodiment, the solder is one of a welding rod, a solder lug, a solder paste, or a composite material.

In a preferable embodiment, the solder is a solder preform coated with soldering flux.

In a preferable embodiment, the two side surfaces of the side wall structure converge toward the second welding plane to form two inclined wall surfaces.

In a preferable embodiment, a ratio of a width of the inclined wall surfaces to a height between the inclined wall surfaces and the first welding plane is 3:1.

In a preferable embodiment, a vertical plane is formed between the second welding plane and each of the two side surfaces of the side wall structure.

In a preferable embodiment, a curved plane is formed between the second welding plane and each of the two side surfaces of the side wall structure.

In a preferable embodiment, a stepped plane is formed between the second welding plane and each of the two side surfaces of the side wall structure.

In a preferable embodiment, an irregular plane is formed between the second welding plane and each of the two side surfaces of the side wall structure.

One of the advantages of the present disclosure is that the side wall structure of the enclosed heat sink provided is able to increase a discharge of gas and soldering flux through reducing the width of a welding plane, so as to reduce an area under pressure, and is able to reduce voids produced during a welding process through structures of the two inclined wall surfaces and the curved planes on two edges of the welding plane, which thereby effectively improves the welding quality.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
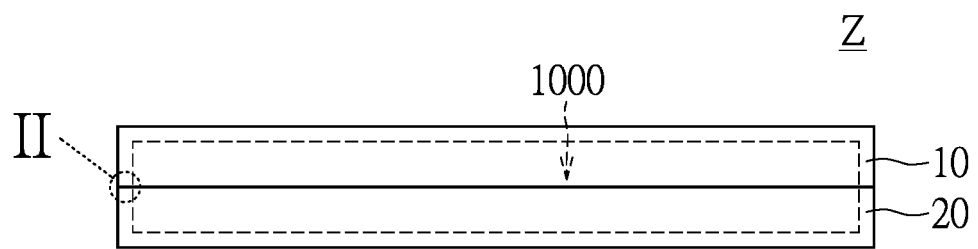
FIG. 1 is a schematic view of a side wall structure of an enclosed heat sink of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
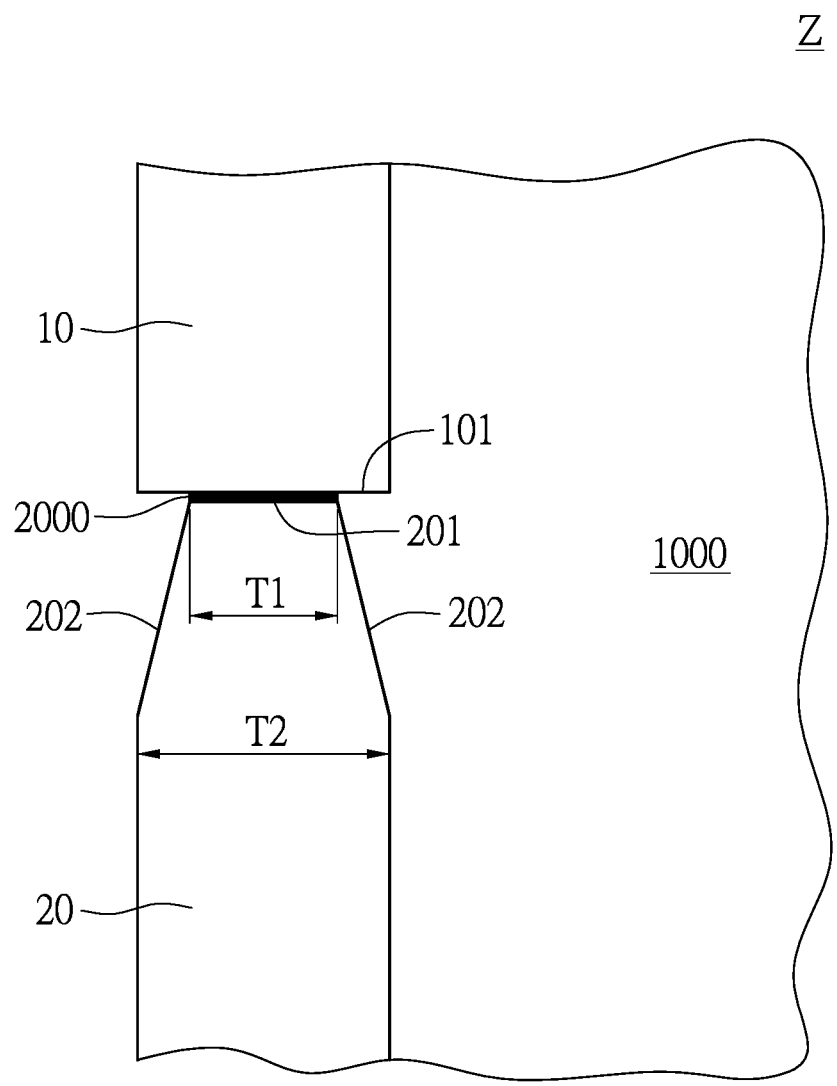
FIG. 2 is an enlarged partial schematic view of part II of FIG. 1 in a first embodiment of the present disclosure.

Referring to FIG. 1 and FIG. 2, a side wall structure of an enclosed heat sink of one embodiment of the present disclosure is provided. The enclosed heat sink Z, such as a water cooling heat sink, includes a cavity 1000 on the inside, and the cavity 1000 can be filled with an adequate amount of working fluid. Moreover, a plurality of diverting channels, a fin array, or a column array can be disposed inside the cavity 1000, which can be varied according to requirements, and the present disclosure is not limited thereto.

Referring to FIG. 2, the side wall structure of the enclosed heat sink provided by the present disclosure substantially includes a welding body 10 and a side wall structure 20, and the welding body 10 and the side wall structure 20 encapsulate the cavity 1000. The welding body 10 can be a side wall or a flat cover. The present disclosure describes the welding body 10 as a side wall, but the present disclosure is not limited thereto.

As mentioned above, the welding body 10 has a first welding plane 101, the side wall structure 20 has a second welding plane 201, and the first welding plane 101 of the welding body 10 and the second welding plane 201 of the side wall structure 20 are pressured and welded to each other.

Moreover, the first welding plane 101 of the welding body 10 and the second welding plane 201 of the side wall structure 20 are preferably pressured and welded to each other through a pre-disposed solder 2000, such that the first welding plane 101 and the second welding plane 201 are pressured and welded to each other to become one. More specifically, the solder 2000 can be in a form of a welding rod, a solder lug, a solder paste, or a composite material. In addition, a shape and size of the solder 2000 can be adjusted according to a shape and size of the first welding plane 101 and the second welding plane 201. In addition, the solder 2000 can be a solder preform coated with soldering flux. In addition, the first welding plane 101 and the second welding plane 201 can also be coated with soldering flux according to actual requirements, and the present disclosure is not limited thereto.

Furthermore, two side surfaces of the side wall structure 20 converge toward the second welding plane 201 to further form two inclined wall surfaces 202. A width T1 of the second welding plane 201 is smaller than a width T2 between two side surfaces of the side wall structure 20. Therefore, the present disclosure is able to increase a discharge of gas and soldering flux through reducing a width of a welding plane, so as to reduce an area under pressure, and is able to reduce voids produced during a welding process through structures of the two inclined wall surfaces on two edges of the welding plane, which thereby effectively improves the welding quality.

Figure 3:
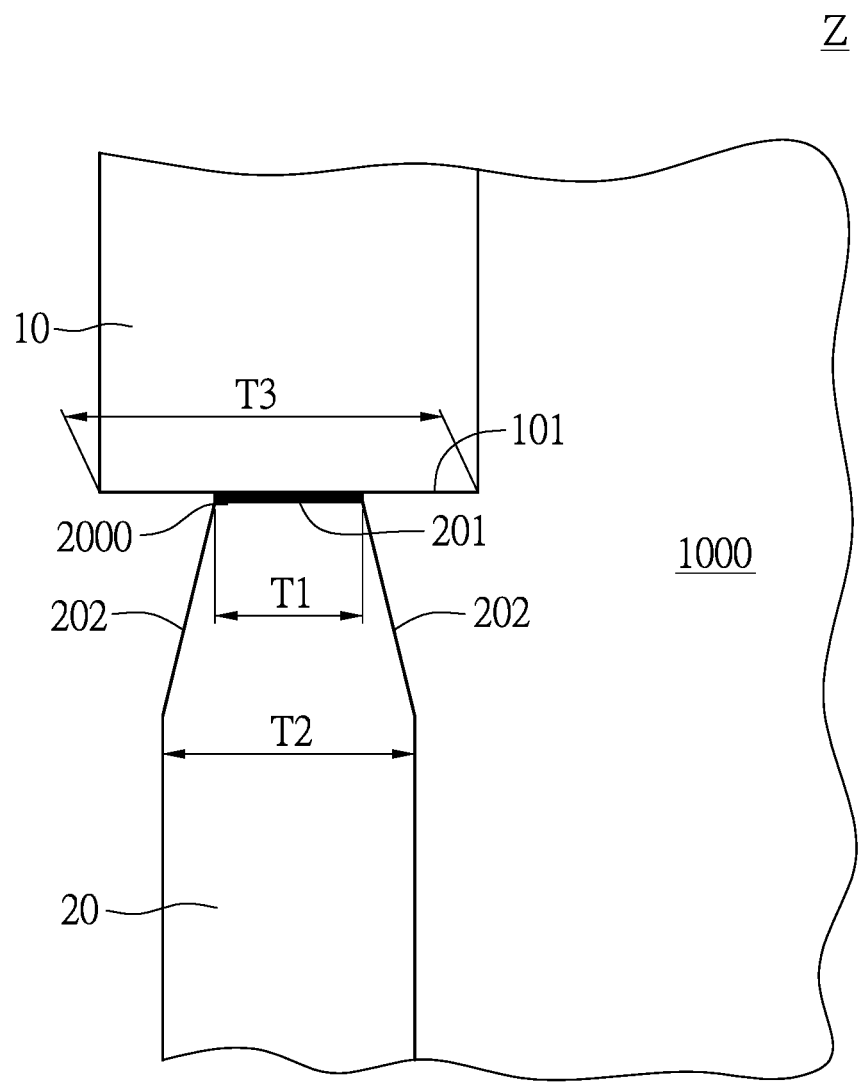
FIG. 3 is an enlarged partial schematic view of part II of FIG. 1 in a second embodiment of the present disclosure.

Referring to FIG. 3, in one embodiment, a width T3 of the first welding plane 101 is greater than the width T2 between the two side surfaces of the side wall structure 20, and the width T3 of the first welding plane 101 is also greater than the width T1 of the second welding plane 201.

Figure 4:
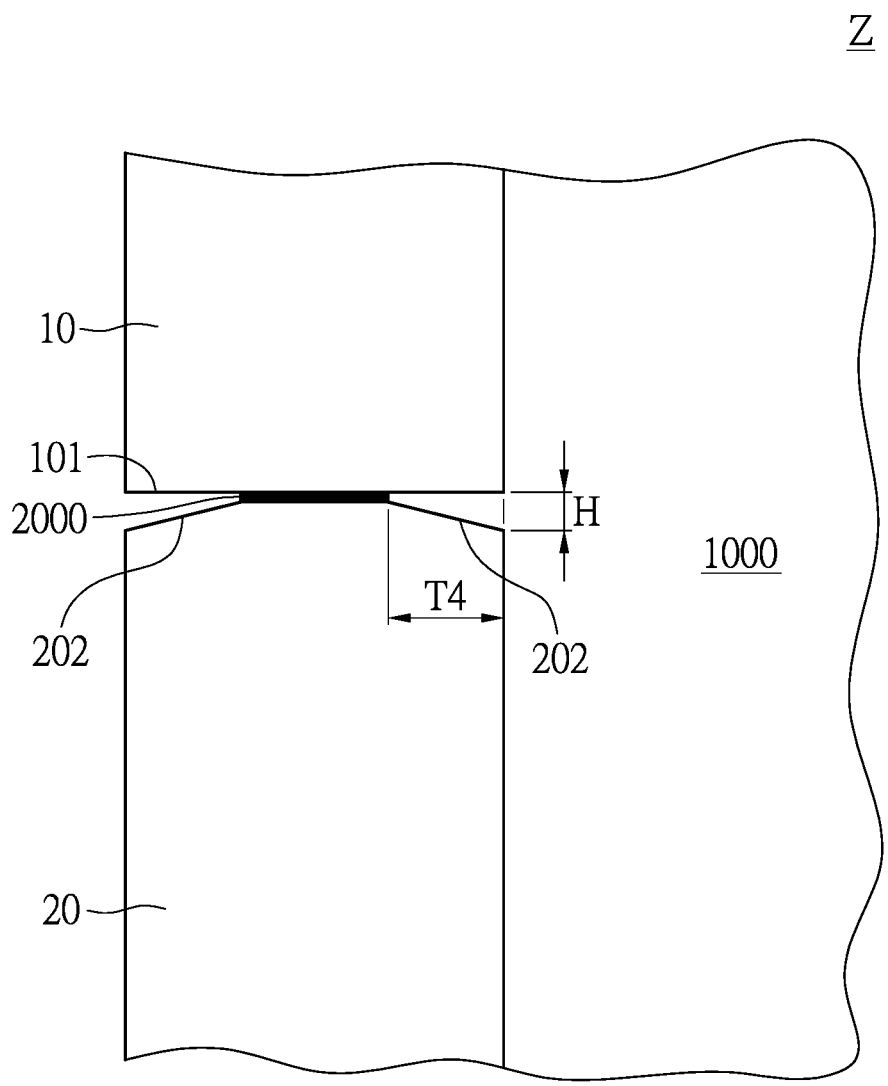
FIG. 4 is an enlarged partial schematic view of part II of FIG. 1 in a third embodiment of the present disclosure.

Referring to FIG. 4, in one embodiment, a ratio of a width T4 of the inclined wall surfaces 202 and a height H to the inclined wall surfaces 202 and the first welding plane 101 is preferably 3:1.

Figure 5:
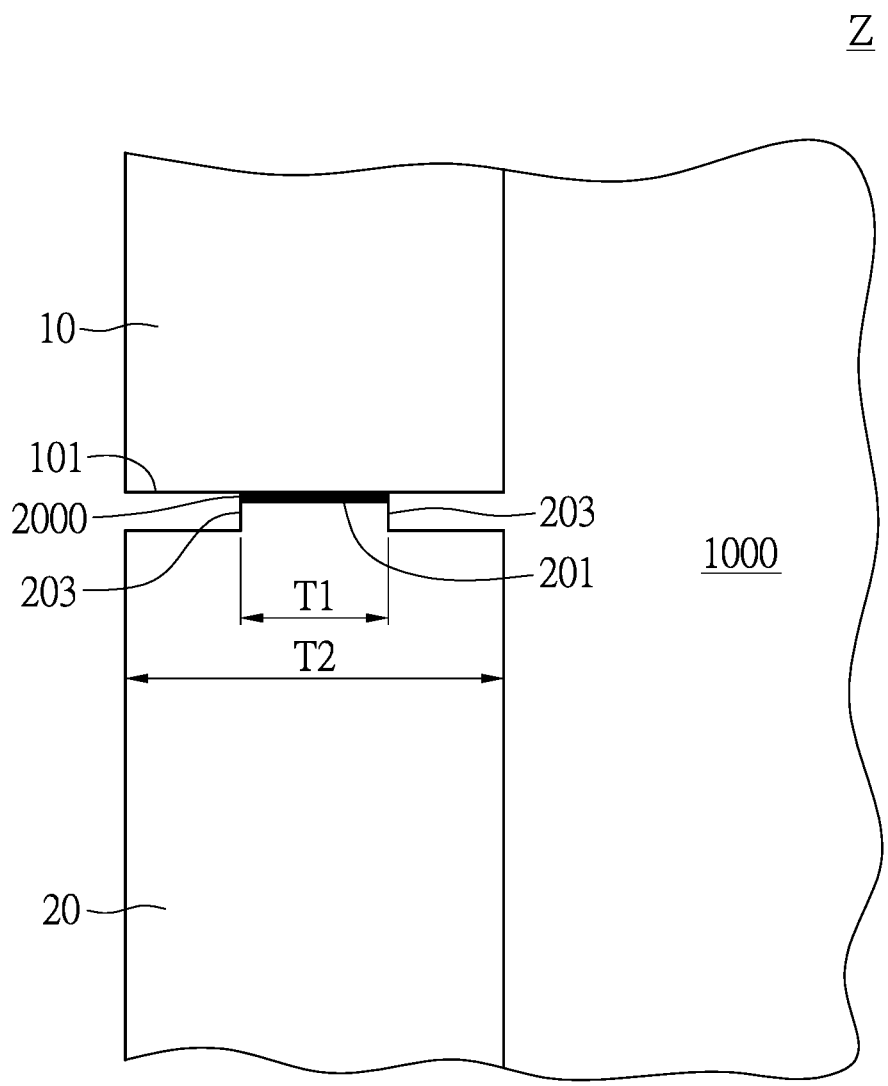
FIG. 5 is an enlarged partial schematic view of part II of FIG. 1 in a fourth embodiment of the present disclosure.

Referring to FIG. 5, in one embodiment, the width T1 of the second welding plane 201 is smaller than the width T2 between the two side surfaces of the side wall structure 20, and a vertical plane 203 is formed between the second welding plane 201 and each of the two side surfaces of the side wall structure 20.

Figure 6:
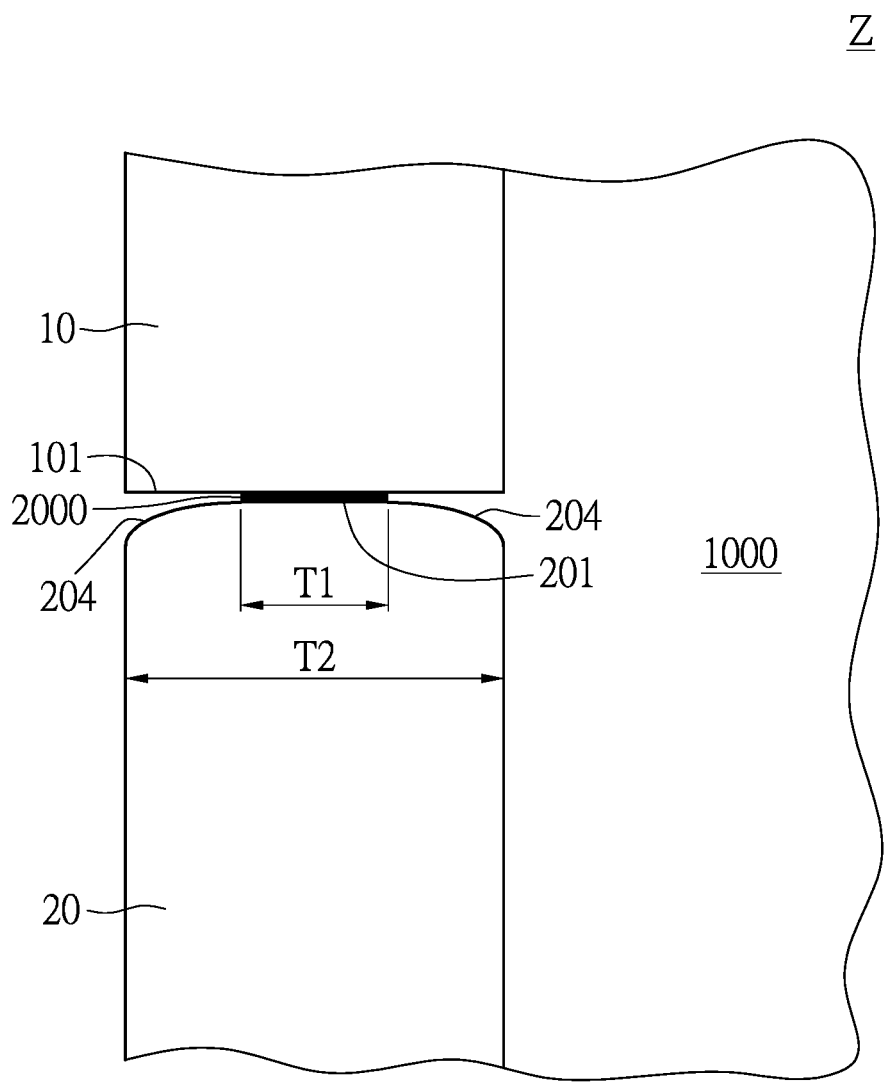
FIG. 6 is an enlarged partial schematic view of part II of FIG. 1 in a fifth embodiment of the present disclosure.

Referring to FIG. 6, in one embodiment, the width T1 of the second welding plane 201 is smaller than the width T2 between the two side surfaces of the side wall structure 20, and a curved plane 204 is formed between the second welding plane 201 and each of the two side surfaces of the side wall structure 20.

Figure 7:
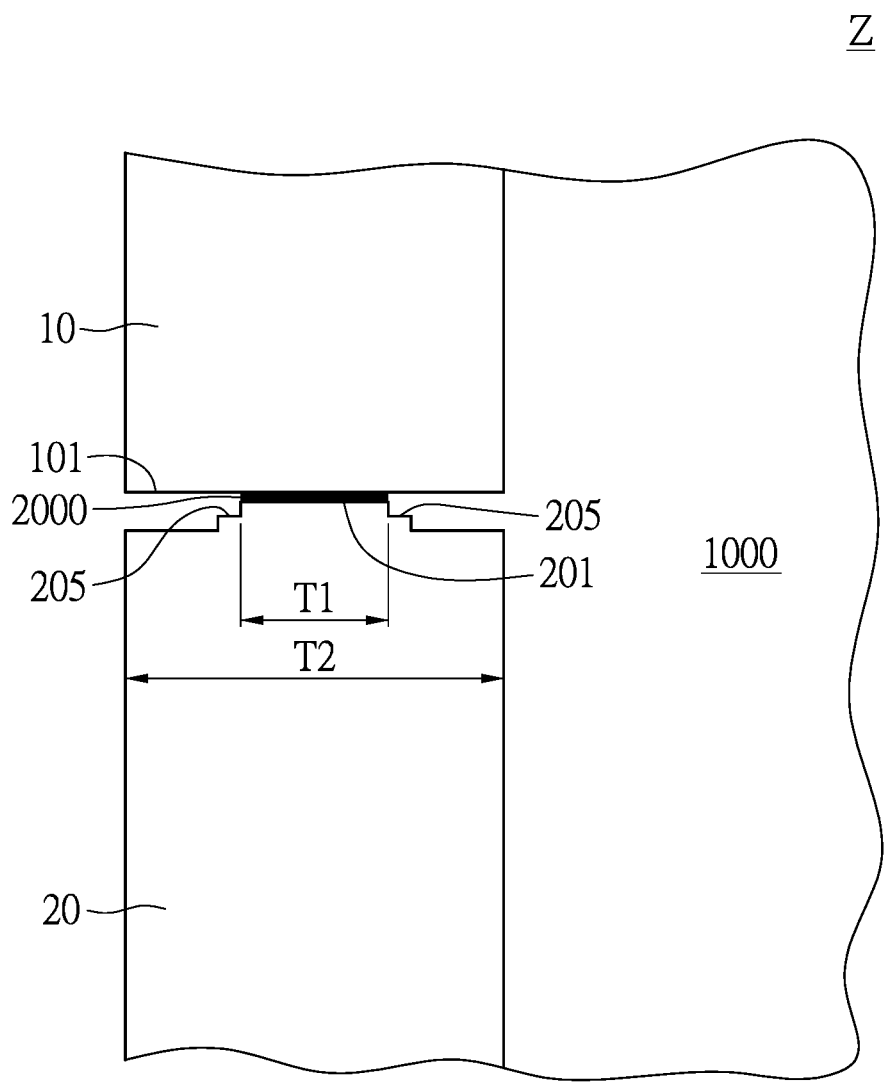
FIG. 7 is an enlarged partial schematic view of part II of FIG. 1 in a sixth embodiment of the present disclosure.

Referring to FIG. 7, in one embodiment, the width T1 of the second welding plane 201 is smaller than the width T2 between the two side surfaces of the side wall structure 20, and a stepped plane 205 is formed between the second welding plane 201 and each of the two side surfaces of the side wall structure 20.

Figure 8:
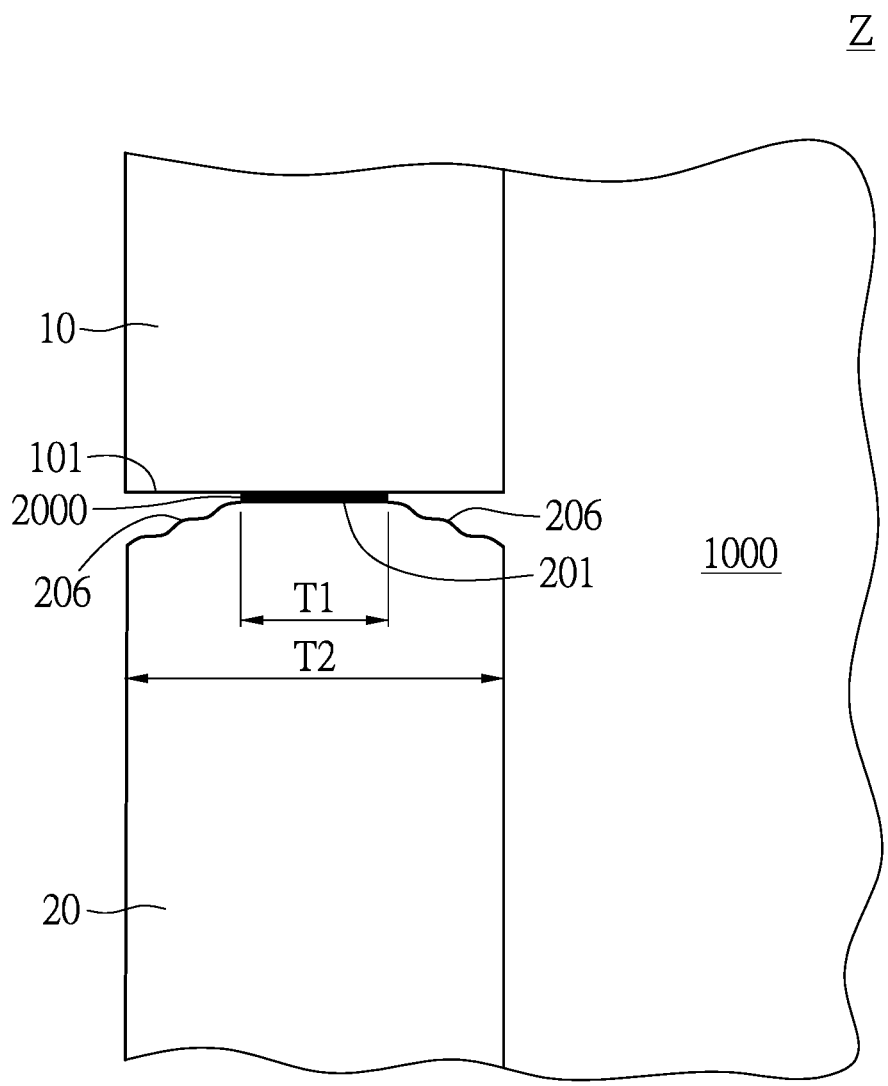
FIG. 8 is an enlarged partial schematic view of part II of FIG. 1 in a seventh embodiment of the present disclosure.

Referring to FIG. 8, in one embodiment, the width T1 of the second welding plane 201 is smaller than the width T2 between the two side surfaces of the side wall structure 20, and an irregular plane 206 is formed between the second welding plane 201 and each of the two side surfaces of the side wall structure 20.

Furthermore, the side wall structure of the enclosed heat sink of the present disclosure can be obtained through a welding method, including the following steps:

pre-disposing the solder 2000 coated with soldering flux between the first welding plane 101 of the welding body 10 and the second welding plane 201 of the side wall structure 20; and pressuring and welding the first welding plane 101 of the welding body 10 and the second welding plane 201 of the side wall structure 20 to become one through the solder 2000. Moreover, during the process of pressuring and welding, since bubbles that are formed by the solder 2000 after a soldering flux reaction are guided in an oblique angle by the two inclined wall surfaces 202, the bubbles can be easily discharged outward, thus reducing the voids produced during the welding process and thereby effectively enhancing the welding quality.

In conclusion, the side wall structure of the enclosed heat sink provided by the present disclosure is able to increase the discharge of gas and soldering flux through reducing the width of the welding plane, so as to reduce the area under pressure, and is able to reduce the voids produced during the welding process through having structures such as the two inclined wall surfaces and the curved planes on the two edges of the welding plane, which thereby effectively improves the welding quality.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An enclosed heat sink with a side wall structure, comprising:
    a welding body having a first welding plane; and
    a side wall structure having a second welding plane, and the first welding plane and the second welding plane being pressured and welded to each other, such that the welding body and the side wall structure encapsulate a cavity;
    wherein a width of the second welding plane is smaller than a width between two side surfaces of the side wall structure;
    wherein the first welding plane and the second welding plane are pressured and welded to each other through a pre-disposed solder.

2. The enclosed heat sink according to claim 1, wherein the two side surfaces of the side wall structure converge toward the second welding plane to form two inclined wall surfaces.

3. The enclosed heat sink according to claim 2, wherein a ratio of a width of the inclined wall surfaces to a height between the inclined wall surfaces and the first welding plane is 3:1.

4. The enclosed heat sink according to claim 1, wherein the solder is one of a welding rod, a solder lug, a solder paste, or a composite material.

5. The enclosed heat sink according to claim 1, wherein the solder is a preform coated with soldering flux.

6. The enclosed heat sink according to claim 1, wherein a vertical plane is formed between the second welding plane and each of the two side surfaces of the side wall structure.

7. The enclosed heat sink according to claim 1, wherein a curved plane is formed between the second welding plane and each of the two side surfaces of the side wall structure.

8. The enclosed heat sink according to claim 1, wherein a stepped plane is formed between the second welding plane and each of the two side surfaces of the side wall structure.

9. The enclosed heat sink according to claim 1, wherein an irregular plane is formed between the second welding plane and each of the two side surfaces of the side wall structure.

* * * * *